(12) United States Patent
Eghan et al.

(10) Patent No.: US 7,061,102 B2
(45) Date of Patent: Jun. 13, 2006

(54) HIGH PERFORMANCE FLIPCHIP PACKAGE THAT INCORPORATES HEAT REMOVAL WITH MINIMAL THERMAL MISMATCH

(75) Inventors: Abu K. Eghan, San Jose, CA (US); Lan H. Hoang, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 658 days.

(21) Appl. No.: 09/879,875

(22) Filed: Jun. 11, 2001

(65) Prior Publication Data

US 2002/0185717 A1 Dec. 12, 2002

(51) Int. Cl.
*H01L 23/34* (2006.01)
*H01L 22/04* (2006.01)

(52) U.S. Cl. .................... 257/713; 257/724; 257/730

(58) Field of Classification Search .............. 257/778, 257/698, 678, 679, 684–686, 690, 700, 713, 257/723, 724, 720, 730, 704, 710, 728; 438/106–108
See application file for complete search history.

(56) References Cited

U.S. PATENT DOCUMENTS

| | | | | |
|---|---|---|---|---|
| 4,598,307 A | * | 7/1986 | Wakabayashi et al. | 257/665 |
| 5,387,888 A | * | 2/1995 | Eda et al. | 333/247 |
| 5,399,898 A | | 3/1995 | Rostoker | |
| 5,410,805 A | | 5/1995 | Pasch et al. | |
| 5,463,529 A | | 10/1995 | Chia et al. | |
| 5,568,683 A | | 10/1996 | Chia et al. | |
| 5,608,261 A | * | 3/1997 | Bhattacharyya et al. | 257/700 |
| 5,637,920 A | | 6/1997 | Loo | |
| 5,700,723 A | | 12/1997 | Barber | |
| 5,723,369 A | * | 3/1998 | Barber | 438/106 |
| 5,726,079 A | | 3/1998 | Johnson | |
| 5,739,585 A | * | 4/1998 | Akram et al. | 257/698 |
| 5,831,825 A | * | 11/1998 | Fromont | 361/719 |
| 5,889,323 A | | 3/1999 | Tachibana | |
| 5,892,280 A | * | 4/1999 | Crane et al. | 257/738 |
| 5,900,675 A | | 5/1999 | Appelt et al. | |
| 5,939,782 A | * | 8/1999 | Malladi | 257/698 |
| 5,977,633 A | | 11/1999 | Suzuki et al. | |
| 6,020,221 A | * | 2/2000 | Lim et al. | 438/125 |
| 6,020,637 A | | 2/2000 | Karnezos | |
| 6,028,358 A | | 2/2000 | Suzuki | |
| 6,084,297 A | | 7/2000 | Brooks et al. | |
| 6,133,634 A | | 10/2000 | Joshi | |
| 6,154,370 A | | 11/2000 | Degani et al. | |
| 6,201,301 B1 | * | 3/2001 | Hoang | 257/712 |
| 6,272,020 B1 | * | 8/2001 | Tosaki et al. | 361/763 |
| 6,368,514 B1 | * | 4/2002 | Metzler | 216/6 |
| 6,436,332 B1 | * | 8/2002 | Fasano et al. | 264/619 |

FOREIGN PATENT DOCUMENTS

| | | |
|---|---|---|
| EP | 0 359 513 A2 | 9/1989 |
| EP | 1 061 577 A2 | 12/2000 |
| JP | 08335650 | 6/1995 |
| JP | 11026635 | 7/1997 |
| JP | 2001044243 | 7/1999 |

* cited by examiner

*Primary Examiner*—Evan Pert
(74) *Attorney, Agent, or Firm*—Edel M. Young; Scott Brown

(57) ABSTRACT

A semiconductor flipchip package includes a central cavity area on the first major side for receiving a flipchip die therein. The package substrate is substantially made from a single material that serves as the support and stiffener and provides within the cavity floor all the connecting points for flipchip interconnection to the silicon die. The integral cavity wall serves as a stiffener member of the package and provides the required mechanical stability of the whole arrangement without the need for a separate stiffener material to be adhesively attached. The cavity walls may contain extra routing metallization to create bypass capacitors to enhance electrical performance. Optional methods to cover the silicon die enhance thermal performance of the package.

10 Claims, 3 Drawing Sheets

HIGH PERFORMANCE FLIPCHIP PACKAGE THAT INCORPORATES HEAT REMOVAL WITH MINIMAL THERMAL MISMATCH

FIELD OF THE INVENTION

The invention relates to packaging of integrated circuits, particularly to flipchip-interconnected packaging that minimizes surface mount assembly temperature variations for a wide range of die sizes.

BACKGROUND OF THE INVENTION

Over the last few years, there has been a surge of activity geared to the use of flipchip interconnection in integrated circuits packages targeted for high performance applications such as networking, storage, and high end CPU computing. There are a number of reasons for this activity in flipchip-interconnected packages. One of the primary drivers spurring this high level of activity is the ability of flipchip interconnection to address pad limitation for these more I/O intensive integrated circuits. A modern integrated circuit die can integrate several million transistors together to form complex systems on a chip. Associated with these complex systems is the need to connect the signals and associated ground and multi-voltage pads from the chip to the supporting package and subsequently to the several hundreds of external connections. Traditional peripheral pad structures run out of room in these devices, making pad array structures used in flipchip interconnection a viable and preferred option.

Another reason flipchip interconnection has become popular for these high performance devices is the added electrical performance afforded by the short I/O interconnects and the ability of flipchip interconnection to support power and ground connections to the precise locations where power and ground connections are needed on the chip.

Multi-layer ceramic substrates, glass-ceramic substrates, and laminated multilayer printed wiring boards (PWB) employing build-up of thin film are among some of the high performance packaging solutions commonly available today to implement flipchip interconnection. Most of these packages are used in surface mount applications. Packages with flipchip interconnections have to be able to withstand the shock of surface mount assembly temperatures, and have an acceptable board-level reliability for the flipchip joints as well as the external ball joints over the anticipated use conditions.

A flipchip die disposed within a package must be flipped and connected to conductors patterned on the package or substrate through conductive balls or bumps on the active side of the chip in a bump array format covering most of the die's active surface. To extend the fatigue life of the die-to-substrate joints, an underfill material of epoxy is typically dispensed and allowed to cure around the joints to hold the interface together. At this stage, the resulting assembly is commonly referred to as capless, and some end users deploy the device in this capless format. Depending on the end application, various thermal enhancement schemes involving heatsinks, heat spreaders, and combination of encapsulants may be applied. The thermo-mechanical impact of some of these schemes can be challenging due to the number of materials and interfaces involved.

FIG. 1 depicts a cross section of a prior-art flipchip ball-grid-array package using a typical substrate 105 with external solder balls 106 for connecting to an external printed circuit board. Lim et al. in U.S. Pat. No. 6,020,221 discloses this type of structure. The silicon chip or die 107 is connected to substrate 105 by solder bumps 109 formed at the active surface of die 107 before it is separated from the silicon wafer. During assembly, the silicon die with the bumps is put in place with the bumps 109 against array contacts 111 on the upper surface of package substrate 105, preferably by solder reflow, though other attachment methods are possible. The space between the die and the substrate is usually filled with underfill material 110, for example epoxy, through capillary action. The material 110 is then cured in place. The underfill material is electrically insulative and can be thermally conducting if required.

To maintain substrate flatness and stiffness, a stiffener 103 may be located at the perimeter of substrate 105 and held in place by epoxy 104. Lim et al. in U.S. Pat. No. 6,020,221 also discloses this stiffener feature. In some cases, the stiffener attachment may precede the die mount process. For thermal performance of die 107, a heat spreader or covering heatsink 101 made typically of metal is connected to die 107 with thermal grease 108, and connected to stiffener 103 with epoxy 102. Heat enhanced structures are known. For example, Chia et al. in U.S. Pat. No. 5,568,683 shows a heat-enhanced package. Not shown in FIG. 1 are the electrical connections formed within substrate 105 that connect solder bumps 109 to respective external solder balls 106.

An organic laminate material may be used for substrate 105. Alternatively, as pointed out by Lan Hoang in U.S. Pat. No. 6,201,301, other materials such as aluminum nitride, silicon carbide, glass ceramic, and polyimide, etc. may be used for substrate 105. These flipchip package substrates are typically formed in several layers with conductors extending between insulating layers. Traces from the plurality of electrically conducting contact pads 111 on the top surface of the substrate route through electrical vias connecting subsequent layers until the traces end in the corresponding external ball pads 113 at the outer surface opposite the face contacting the die 107. In organic material, several of these layers are laminated together or use sequential build-up technology to form the substrate. In ceramic substrates, the thin ceramic layers with metal circuits on top of them are stacked up and fired at high temperatures to achieve the desired structure. Fujitsu, Kyocera, NTK, 3M (Gore), Unicap, and Ibiden are among manufacturers who offer high performance ceramic as well as laminate ball grid array packages (BGAs).

FIG. 2 shows another prior art package with base substrate 105 sharing similar material characteristics with the one described in FIG. 1. For ease of review, elements having the same structure and function are given the same reference numerals. In the structure depicted in FIG. 2, the base substrate stiffening function is performed by a single piece heat spreader cover 201. The one-piece lid serves the functions of stiffening and heatsinking at the same time.

A problem associated with most of these conventional high performance flipchip packaging structures is that the structure is relatively complex and can be difficult to manufacture. They encompass several different material types that are adhesively bonded to form the package. The thermal interaction between these materials as the structures are exposed to the normal fabrication process temperatures can lead to warpage, lack of planarity and contact issues. Furthermore, normal component mount reflow temperatures and subsequent temperature and power cycles experienced by such complex composite structures during use can lead to thermo-mechanical failures.

A packaged device brings together several materials having different coefficients of thermal expansion (CTE).

Among them is the silicon die with CTE between 2.5 and 3 ppm/° C. Substrates can vary from ceramic with CTE around 5.0 ppm/° C. to glass-ceramic with CTE typically 8 to 12 ppm/° C. to organic laminate with CTE over 16.0 ppm/° C. Encapsulants and underfill based on thermoset epoxy can have CTE around 12 to 18 ppm/° C. below their glass transition temperature Tg and much higher numbers such as 50 to 70 ppm/° C. above their Tg. Heatsinks and heat spreaders are typically made with copper, having typical CTE values of 16.5 ppm/° C. One of the challenges in modern electronic packaging is to select materials with closely matched CTE over the temperature of interest. This way the normal sources of temperature variations during the component manufacture, testing, reflow onto a board, and subsequent power cycles during use, will minimize CTE-stress-induced failures and thus improve reliability.

The structure of FIG. 1 uses the window stiffener 103 to achieve overall package stiffness. Without it, the substrate 105 is likely to bend as the underfill cools after cure. Though effort is made in material selection to match substrate 105 and stiffener 103 in CTE values, perfect matching is not always possible over the range of temperatures. The cover structure 201 in FIG. 2 serves a similar stiffness function. Again, any variation in expansion differences or a failure in adhesion 104 can lead to loss of function and reliability. It is desirable to minimize the bending of the composite component structure made by die 107 and substrate 105.

SUMMARY OF THE INVENTION

The present invention is directed to enhancing the structure used in making these packages to make the packages simpler to put together, reduce warpage during assembly, and minimize interfacial stresses without changing base function of the high performance package. The present invention provides an improved semiconductor package that minimizes the number of material types and interfaces required to implement heatsink in a thermally enhanced flipchip BGA package substrate. According to the invention, a single structure incorporating a cavity area for the die serves as both the support substrate and stiffener. The single rigid substrate with a cavity in which the die is mounted with flipchip interconnect addresses the stiffness function with a simple manufacturing step, and more importantly provides perfectly matched CTE between walls and floor of the package, so that it does not cause CTE interfacial reliability problems. Having matched CTE walls and floor of the cavity package allows the use of encapsulants without worrying about in-plane and z-axis CTE differences between the periphery of the cavity floor and the edge of the inner cavity wall.

The connecting points to the external balls end in an array of pads in the cavity area within the boundary of the die. This structural arrangement substantially eliminates interfacial stresses associated with adhesively attached stiffeners made from heterogeneous materials having different CTEs over the range of operating temperature. The single unitary structure includes conductive wiring layers in which conductors are formed connecting the conductors on the silicon die to conductors such as solder balls external to the package. Several optional top surfaces and encapsulants that can be used with the base are described.

The shape of this single unitary structure allows it to be used as a container or dam for receiving encapsulating material to provide die protection. Again, due to the homogeneous nature of the floor and the walls, this arrangement lends itself to selecting an encapsulant with the appropriate CTE.

Also, as a feature of the invention, because the cavity wall is part of the continuous substrate, it is possible to extend some circuit function into the wall. In particular., plate capacitors in the wall can serve as high frequency bypass capacitors in proximity to the die. The wall of the single unitary structure may include interleaved conductive layers forming one or more chip capacitors for high frequency bypass purposes. When the single unitary structure is formed primarily of material with moderate dielectric constant (and CTE of 5 to 9 ppm/° C.) such as ceramic or glass material, conductive and insulating materials may be formed in successive thin layers to create parallel plate capacitors with the ceramic as the dielectric. Placing a capacitor adjacent to the silicon chip provides immediate charge stability to the power and ground voltages experienced by the silicon chip, reducing ground bounce and improving high speed switching characteristics of the integrated circuit device.

DETAILED DESCRIPTION

Figure 2:
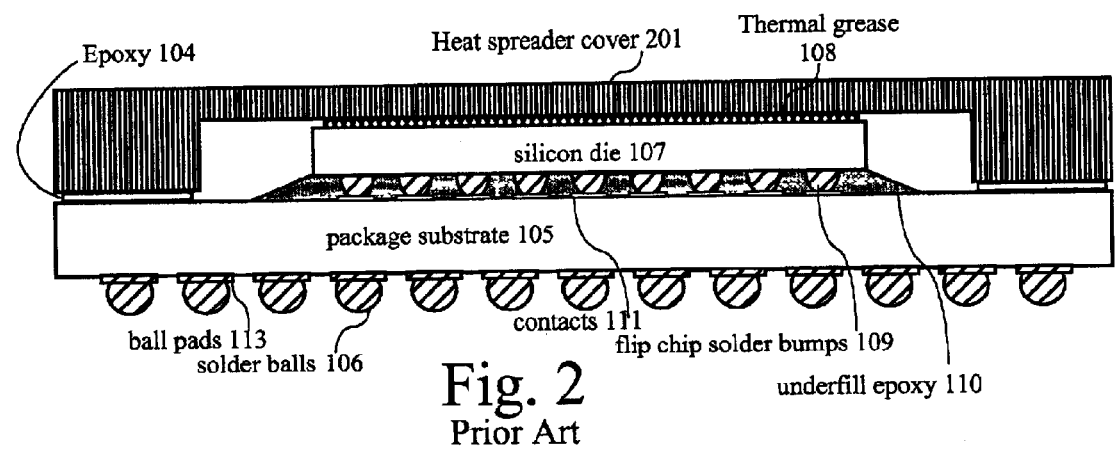
Figure 3:
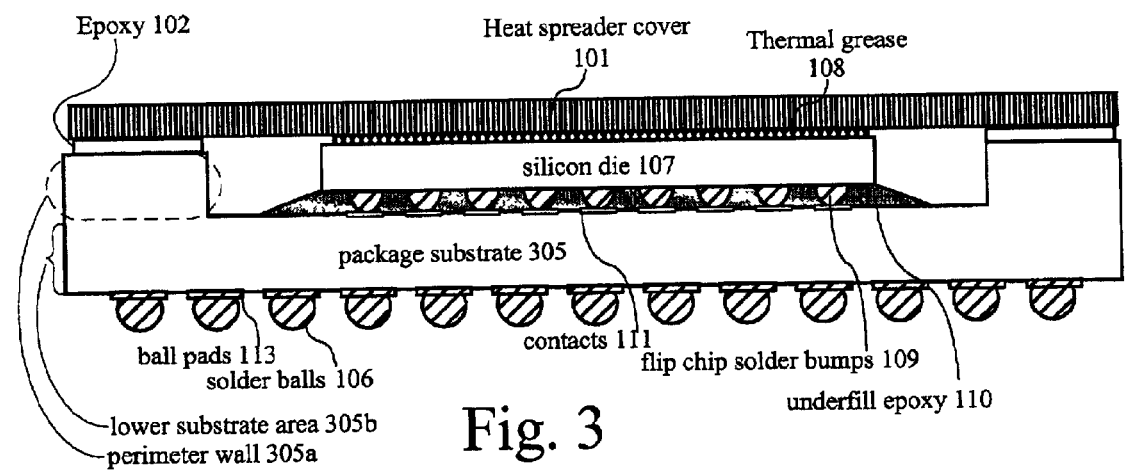
FIGS. 3–6 represent package structures according to the invention having unitary structures comprising both the package substrate and perimeter walls and having several different arrangements for thermal enhancement.

FIG. 3 shows one embodiment of the invention in which package 305 comprises a unitary structure having a central recessed region surrounded by perimeter walls 305a. Positioned within the central recessed region is silicon die 107 electrically connected to a plurality of contacts 111 in the central recessed region by solder bumps 109 and held in place by underfill epoxy 110. Unlike the prior art structures of FIGS. 1 and 2, package 305 is not just flat but incorporates the perimeter walls 305a as a single continuous piece with a lower substrate floor region 305b. The structure itself can have similar material characteristics to those used in prior art structures. A material laminate for package 305 may be procured from Kyocera, Japan as the HiTCE integrated circuit substrate with CTE of 12 ppm/° C. In the package 305, as illustrated, the cavity floor interconnect metal is patterned to define an array of contact pads 111 that correspond to a similar arrangement of bumps 109 on the die 107. The contact pads 111 are preferably copper that is plated with nickel and then gold before the bumps 109 are formed. Vias and traces from the contact pads 111 snake their way through metallization layers and insulating material to the external ball pads 113 for contacting the external balls 106.

Figure 1:
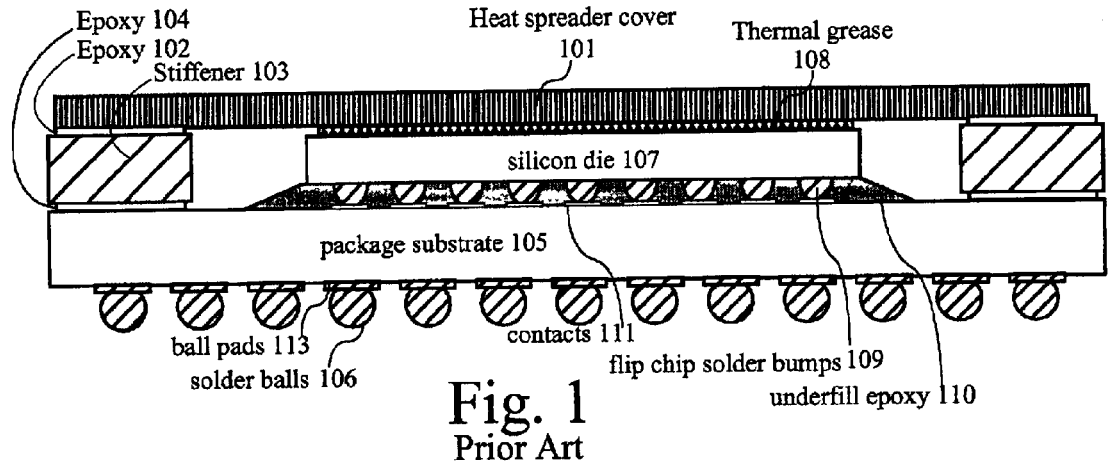
FIGS. 1 and 2 represent cross sections of prior art package structures having flat laminated substrates.

Forming the floor or lower substrate layer 305b and stiffening walls 305a of package 305 as a single piece eliminates the thermal mismatch normally associated with traditional metal stiffeners 103 that are adhesively attached, and eliminates any possibility of delamination that can occur with the structures of FIGS. 1 and 2.

Several structures for implementing silicon die 107 in package 305 are shown to take advantage of the simpler structure.

In FIG. 3, heat spreader 101, made preferably with a thin compliant metal, is connected to silicon die 107 with thermal grease 108 and attached to the top of walls 305a of package 305 by adhesively tacking in discontinuous sections with epoxy 102 (discontinuous to allow air or trapped moisture to escape during reflow). This produces a thermally enhanced package with a full heatsink.

Figure 4:
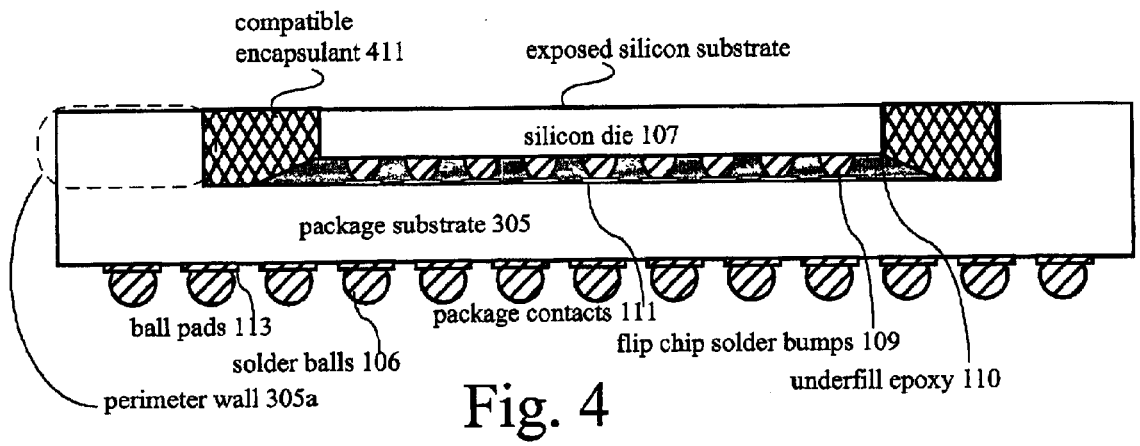

In FIG. 4, the silicon die 107 is left exposed, but is held and protected by a thermally conductive encapsulant 411. The back of the silicon die 107 is positioned flat with the top of the cavity wall 305a. A lower profile thermally enhanced package results. Also, the encapsulant in this embodiment is in contact with the unitary cavity floor and dam walls, minimizing the chances for dissimilar material expansion differences and potential delamination in that vicinity.

Figure 5:
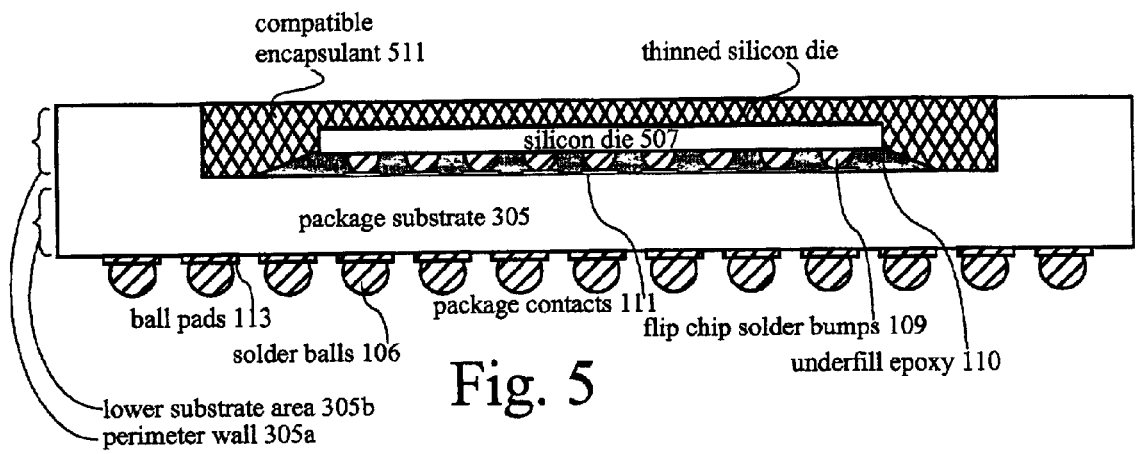

FIG. 5 represents another embodiment in the use of this packaging where heat dissipation may not be the primary objective but the need to cover the silicon die and produce a low profile package may be paramount. In this embodiment, the silicon die 507 is thinned down prior to mounting so that the encapsulant can completely cover the whole die and the adjacent areas. The choice of encapsulant can be tailored to the heat needs of the arrangement. Thus in FIG. 5, die 507 is recessed within package 305, and encapsulant 511 covers both the sides and the exposed surface of die 507.

Figure 6:
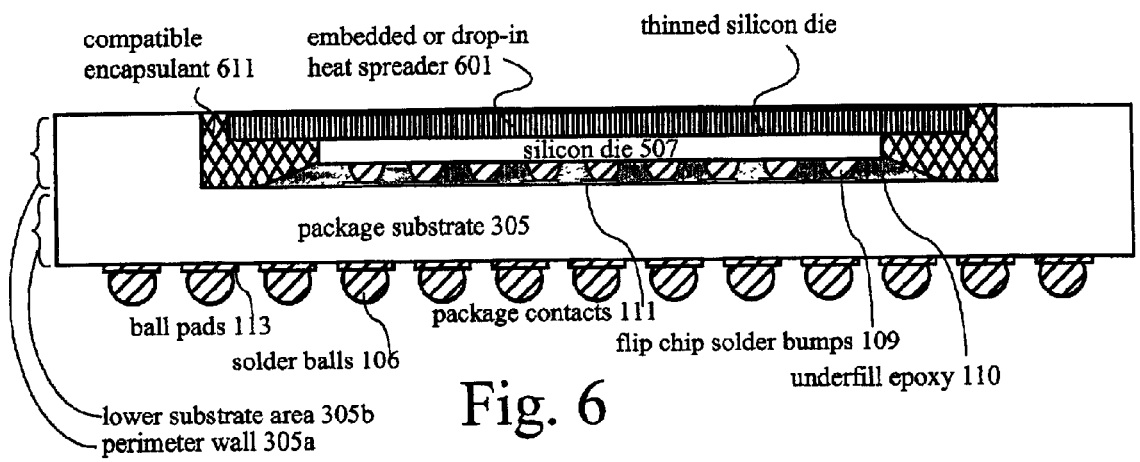

In FIG. 6, an embedded or drop-in heat spreader 601 covers the exposed surface of die 507, mating with encapsulant 611 to protect die 507 and provide attachment for an external heatsink (not shown) if desired.

Chip Capacitor in Package Wall

Figure 7:
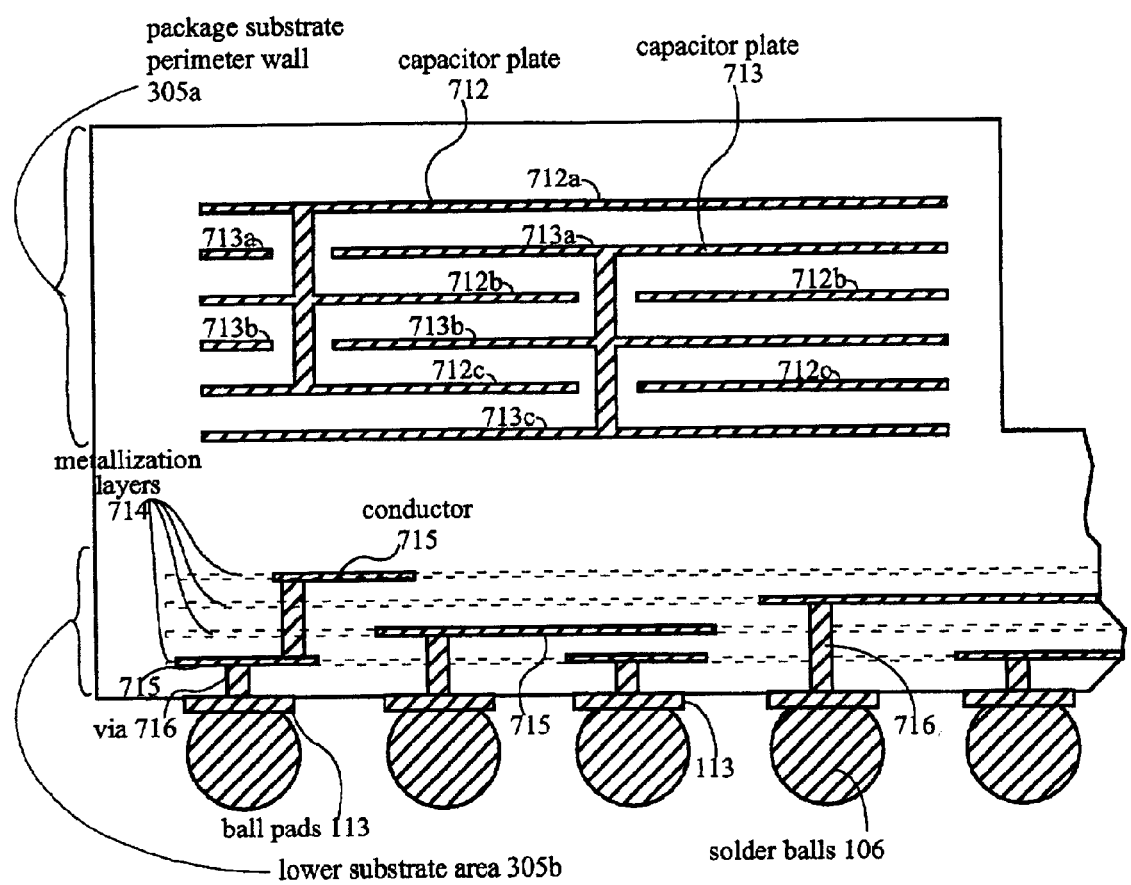
FIG. 7 represents cross section detail of a package structure according to the invention illustrating how a capacitor is incorporated into the perimeter walls.

FIG. 7 shows a portion of package wall 305a and lower substrate area 305b in greater detail, illustrating some of the electrical connections within package 305. In the embodiment of FIG. 7, the raised perimeter wall region 305a includes one or more chip capacitors. Each capacitor is formed such that each capacitor plate 712 and 713 has a plurality of layers, and the layers of one plate alternate with layers of the other plate, separated by insulation. In FIG. 7, layers 712a, 712b, and 712c of capacitor plate 712 alternate with layers 713a, 713b, and 713c of capacitor plate 713. Placing these layers close together, separated only by thin insulating layers allows the capacitance value to be large. Further, placing the chip capacitor (or capacitors) within the package walls puts the capacitor close to the chip so that it can maintain steady supply voltage in the presence of high speed switching. In particular, the capacitor can accommodate the high speed input/output switching that occurs on a serial input/output bus.

FIG. 7 also shows metallization layers 714 within lower substrate area 305b. Solder balls 106 are joined to ball pads 113, which are connected through vias 716 to conductors 715 in one of the metallization layers 714. The conductors in one metallization layer may be connected through further vias 715 to further conductors and eventually to package contact pads 111 (shown in the earlier figures). Thus electrical connection is made between solder balls 106 external to the package and solder bumps 109 (shown in earlier figures).

What is claimed is:

1. An integrated circuit package substrate comprising:
    a recessed central region, defined by perimeter walls and a lower substrate floor, having a plurality of contacts for providing electrical contact to an integrated circuit device; and
    a raised peripheral area, within the perimeter walls, including at least one by-pass capacitor connected to contacts within the recessed central region, wherein the raised peripheral area is formed integrally with the substrate floor.

2. The integrated circuit package substrate of claim 1 wherein the capacitor has a sandwich construction comprising a plurality of ground plates connected to a ground terminal alternating with a plurality of power plates connected to a power terminal, and insulating material is disposed between adjacent plates.

3. The integrated circuit package substrate of claim 2 wherein the ground and power terminals are connected respectively to ground and power supply terminals of the integrated circuit device.

4. A packaged integrated circuit device comprising:
    a substrate having a recessed central region surrounded by a raised perimeter, the recessed central region and the perimeter comprising substantially the same material, the recessed central region having a plurality of contacts within the recessed central region for providing electrical connection from conductors external to the substrate to an integrated circuit device;
    an integrated circuit device formed with contacts on a top surface, flipped, and placed against the recessed central region of the substrate such that the contacts of the integrated circuit device meet the contacts of the recessed central region of the substrate; and
    a heat spreader connected to the integrated circuit device with thermal grease, wherein the integrated circuit device and the heat spreader are recessed such that an upper surface of the heat spreader is planar with an upper surface of the raised perimeter.

5. The packaged integrated circuit device of claim 4 therein the contacts of the recessed central region of the substrate are electrically connected to solder balls on an external surface of the packaged integrated circuit device.

6. The packaged integrated circuit device of claim 4 therein the substrate is formed primarily from a ceramic material.

7. The packaged integrated circuit device of claim 6 wherein the ceramic material also includes glass, thereby comprising a glass ceramic material.

8. The packaged integrated circuit device of claim 4 wherein the contacts of the recessed central region of the substrate comprise solder bumps.

9. The packaged integrated circuit device of claim 4 wherein the raised perimeter includes electrical circuitry electrically connected to power and ground contacts of the integrated circuit device.

10. The packaged integrated circuit device of claim 9 wherein the electrical circuitry includes a by-pass capacitor.

* * * * *